(12) United States Patent
Lin et al.

(10) Patent No.: US 6,603,184 B2
(45) Date of Patent: Aug. 5, 2003

(54) DOUBLE HETEROSTRUCTURE PHOTODIODE WITH GRADED MINORITY-CARRIER BLOCKING STRUCTURES

(75) Inventors: Chih-Hsiang Lin, Sugar Land, TX (US); Jeffery L. Johnson, Sugar Land, TX (US); Klaus Alexander Anselm, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 09/774,480

(22) Filed: Jan. 30, 2001

(65) Prior Publication Data

US 2002/0027238 A1 Mar. 7, 2002

Related U.S. Application Data

(60) Provisional application No. 60/230,322, filed on Sep. 6, 2000.

(51) Int. Cl.[7] .............................................. H01L 31/075
(52) U.S. Cl. ........................ 257/458; 257/431; 257/461
(58) Field of Search ................................ 257/431, 458, 257/461

(56) References Cited

U.S. PATENT DOCUMENTS

| | | | |
|---|---|---|---|
| 4,961,098 A | | 10/1990 | Rosbeck et al. |
| 5,016,073 A | | 5/1991 | Elliott et al. |
| 5,563,423 A | * | 10/1996 | Wu et al. ...................... 257/21 |
| 6,081,019 A | * | 6/2000 | White ........................ 257/448 |
| 6,107,652 A | * | 8/2000 | Scavennec et al. .......... 257/184 |
| 6,300,557 B1 | * | 10/2001 | Wanlass ..................... 136/255 |
| 6,316,771 B1 | * | 11/2001 | Jurisson et al. ......... 250/339.01 |

OTHER PUBLICATIONS

Johnson, J. L. et al., "Electrical and Optical Properties of Infrared Photodiodes Using the $InAs/Ga_{1-x}In_xSb$ Superlattice in Heterojunctions with GaSb," *J. Appl. Phys.* 80(2), (1996), pp. 1116–1127.

Bürkle, L et al., "Electrical Characterization of InAs/(GaIn)Sb Infrared Superlattice Photodiodes for the 8 to 12 $\mu m$ Range," *Material Research Society Symposium Proceedings*, vol. 607, (2000), pp. 77–82.

Fuchs, F. et al., "$InAs/Ga_{1-x}In_xSb$ Infrared Superlattice Photodiodes for Infrared Detection," *Proc. SPIE*, vol. 3287, (1998), pp. 14–21.

Ashley, T. and Elliott, C.T., "Operation and Properties of Narrow–Gap Semiconductor Devices Near Room Temperature Using Non–Equilibrium Techniques," *Semicond. Sci. Technol.* 6, (1991), pp. C99–C105.

* cited by examiner

*Primary Examiner*—Douglas A. Wille
(74) *Attorney, Agent, or Firm*—N. Stephan Kznsella

(57) ABSTRACT

An embodiment of a radiation detector includes a semiconductor-based blocking structure interposed between the detector's absorption region and at least one of its contact structures. The blocking structure is adapted to prevent minority carriers generated within the adjacent contact structure from reaching the absorption region, and may also prevent minority carriers generated within the absorption region near the contact structure from entering the contact structure. Majority carriers, on the other hand, may be substantially unimpeded by the blocking structure in moving from the absorption region to the contact structure. In an embodiment, the blocking structure has a higher effective energy gap than its adjacent contact structure and than the absorption region. The interface between the blocking structure and the absorption region may be graded, so that the effective energy gap decreases gradually between the blocking structure and the absorption region.

22 Claims, 3 Drawing Sheets

DOUBLE HETEROSTRUCTURE PHOTODIODE WITH GRADED MINORITY-CARRIER BLOCKING STRUCTURES

CROSS-REFERENCES TO RELATED APPLICATIONS

This nonprovisional U.S. national application, filed under 35 U.S.C. §111(a), claims, under 37 C.F.R. §1.78(a)(3), the benefit of the filing date of provisional U.S. national application No. 60/230,322, filed on Sep. 6, 2000 under 35 U.S.C. §111(b), the entirety of which is incorporated herein by reference.

BACKGROUND OF THE INVENTION

1. Field of the Invention

This invention pertains to detection of radiation, and more particularly to a device for detection of radiation which may include mid- and long-wavelength infrared radiation, having wavelength from 2 to 30 $\mu$m.

2. Description of the Related Art

The following descriptions and examples are not admitted to be prior art by virtue of their inclusion within this section.

There are a variety of applications in which it is desirable to convert infrared radiation into electrical signals. Examples of such applications include thermal imaging and transmission of information using signals having infrared wavelengths. Of the various approaches to detection of mid- and long-wavelength infrared radiation having wavelengths from about 2 $\mu$m to about 30 $\mu$m, one of the most popular approaches is the use of a semiconductor p-n junction. Other approaches, such as the use of bolometers which detect temperature changes caused by incident radiation, or quantum-well intra-subband detectors in which incident radiation causes excitation of electrons between confined energy states of a quantum well, generally provide lower sensitivity and/or slower frequency response.

Operation of a basic semiconductor p-n junction photodetector is illustrated by the energy band diagrams of FIG. 1. An energy band diagram, showing electron energy vs. distance, of a p-n junction under equilibrium conditions is shown in FIG. 1(a). This diagram includes conduction band edge 10, valence band edge 12, and Fermi energy level 14. The energy difference 16 between the conduction and valence band energies is known as the energy gap, or bandgap, of the semiconductor. Because the same semiconductor material is used throughout the junction of FIG. 1(a), this energy gap is shown as constant with distance throughout the junction. Conduction in a semiconductor can generally be described in terms of the movement of electrons in the conduction band (having energy at and above that of conduction band edge 10) and holes in the valence band (having energy at and below that of valence band edge 12). The proximity of Fermi level 14 to conduction band edge 10 on the left side of the junction indicates that this portion of the semiconductor is doped n-type, while the right side of the junction is doped p-type. On the n-type side of the junction the majority carriers are electrons and the minority carriers are holes, while the reverse is true on the p-type side. The p-n junction includes a built-in electric field Eo in the junction region where the conduction and valence band edges are bent. The field exerts a force moving any holes appearing in this junction region to the right (in the direction of the field, as shown by the arrow in FIG. 1(a)), and moving any electrons appearing in the junction region to the left (opposite the direction of the field).

A junction photodetector, or photodiode, is typically operated with the p-n junction reverse-biased, as shown in FIG. 1(b). As in the case of built-in electric field of FIG. 1(a), the larger applied electric field of FIG. 1(b) forces electrons toward the n-type side of the junction and holes toward the p-type side. Electrons and holes may be generated in the junction region by absorption of an incident photon such as photon 18. If photon 18 has energy higher than energy gap 16, absorption of the photon may provide energy to excite an electron from the valence band to the conduction band, creating conduction electron 20 and hole 22. The junction region 24 over which electric field E appears may be considered the absorption region of the photodiode, while the outer neutral n-type and p-type regions may be considered contact regions for collecting the photogenerated carriers and connecting the photodiode to a surrounding circuit. Since electrons are collected on the n-type side and holes on the p-type side, each contact region collects photogenerated majority carriers. It should be noted that the designation of a "majority" or "minority" carrier is dependent upon the location of the carrier within the device. A hole formed by absorption of a photon on the n-type side of the diode is a minority carrier when formed, and becomes a majority carrier upon being transported by the electric field to the p-type side of the diode.

The absorption and contact regions of the photodetector of FIG. 1 are formed using semiconductor materials. Semiconductor alloys have been used traditionally. In recent years, semiconductor superlattices formed from thin alternating layers of two different semiconductors have been used in photodetector structures. Discussion of superlattice photodiodes may be found, for example, in papers by Johnson et al. ("Electrical and optical properties of infrared photodiodes using the InAs/Ga$_{1-x}$In$_x$Sb superlattice in heterojunctions with GaSb," *J. Appl. Phys.* 80(2), pp. 1116–1127, 1996), Bürkle et al. ("Electrical characterization of InAs/(GaIn)Sb infrared superlattice photodiodes for the 8 to 12 $\mu$m range," *Mat. Res. Soc. Symp. Proc.* Vol. 607, p. 77, 2000), and Fuchs et al. ("InAs/Ga$_{1-x}$In$_x$Sb infrared superlattice photodiodes for infrared detection," *Proc. SPIE* 3287, p. 14, 1998). The constituent layers of a superlattice as described in these references are thin enough that the energy band structures of the layers interact with each other to form conduction and valence "minibands" extending throughout the superlattice. The lowest-energy conduction miniband may be described as the "effective conduction band", the highest-energy valence miniband may be described as the "effective valence band", and the energy difference between these bands may be described as the "effective energy gap", or "effective bandgap" of the superlattice. Energy band diagrams as used herein are intended to represent either actual band structure for alloy material implementations or effective band structure in the case of superlattice implementations. Furthermore, the phrase "energy gap" or "bandgap" is intended to also refer to an effective energy gap in the case of superlattice implementations. Similarly, the phrase "effective energy gap" or "effective bandgap" may refer to an actual bandgap in the case of an alloy material implementation.

The efficiency and sensitivity of a photodetector such as that of FIG. 1 can be limited by various processes. For example, carriers can be generated by thermal energy in the semiconductor rather than by photon absorption, creating a "dark current" limiting the ability of the detector to detect low radiation levels. Such thermal generation may be particularly problematic for mid- and long-wavelength infrared detectors, since the energy gaps of such detectors are relatively small, and corresponding thermal generation rates are therefore relatively high. Other carrier generation processes such as Auger generation may also be significant, particularly for narrow-gap semiconductors. Minority carriers can cause problems in the device even when generated by photon absorption, in that such minority carriers may recombine with majority carriers instead of crossing the device to be collected at the appropriate contact. Such recombination causes a loss of signal, reducing the quantum efficiency of the photodiode.

One approach which has been used in attempting to mitigate problems such as described in above is to replace the p-n junction of FIG. 1 with a heterojunction in which one side of the junction is formed from a material having a larger energy gap. Such a p-n heterojunction, as described in U.S. Pat. No. 4,961,098 to Rosbeck et al. and U.S. Pat. No. 5,016,073 to Elliott et al. (hereinafter "Elliott"), may be advantageous by reducing the thermally-generated dark current of the diode, since thermal generation is greatly reduced in the wide-bandgap portion of the device. It is taught in Elliot that the heterojunction between the p-type and n-type sides of the junction may be graded to prevent conduction barriers caused by heterojunction band discontinuities. An additional approach described in Elliott is forming a heterojunction at the interface between the p-type side of the junction and the p-type contact region, such that the contact region has a larger energy gap than the absorption region. In the photodetector of Elliot this p-p heterojunction is arranged within a minority-carrier (electron, in this case) diffusion length of the above described p-n heterojunction. It is taught in Elliot that the proximity of the two heterojunctions causes a reduction in minority carrier density on the p-type side of the p-n heterojunction, allowing operation at higher temperatures than normally attainable. In a paper by T. Ashley and C. T. Elliot, "Operation and properties of narrow-gap semiconductor devices near room temperature using non-equilibrium techniques," *Semicond. Sci. Technol.* 6, pp. C99–C105, 1991 (hereinafter "Ashley"), a structure similar to that in the Elliot patent is discussed, in which a relatively thin high-bandgap layer is interposed between the p-type side of the junction and the p-type contact layer. The use of such a thin high-bandgap layer allows it to be formed from a strained, non-lattice-matched material.

Although the structures of the above-described references provide at least the advantages noted above, some issues do not appear to be addressed by these structures. For example, the structures described above do not prevent, or provide an impediment to, minority carriers generated in both contact regions from entering the absorption region of the detector. Although the structure of Ashley prevents minority carriers in the p-type contact region from entering the absorption region, this is not the case on the n-type side of the device. Furthermore, the interfaces within structures such as those of Elliott and Ashley may cause increased recombination of photogenerated carriers. It would therefore be desirable to develop a technique or design to simultaneously increase the collection efficiency and reduce the noise current in infrared photodiodes.

BRIEF DESCRIPTION OF THE DRAWINGS

Other objects and advantages of the invention will become apparent upon reading the following detailed description and upon reference to the accompanying drawings in which.

Figure 1A:
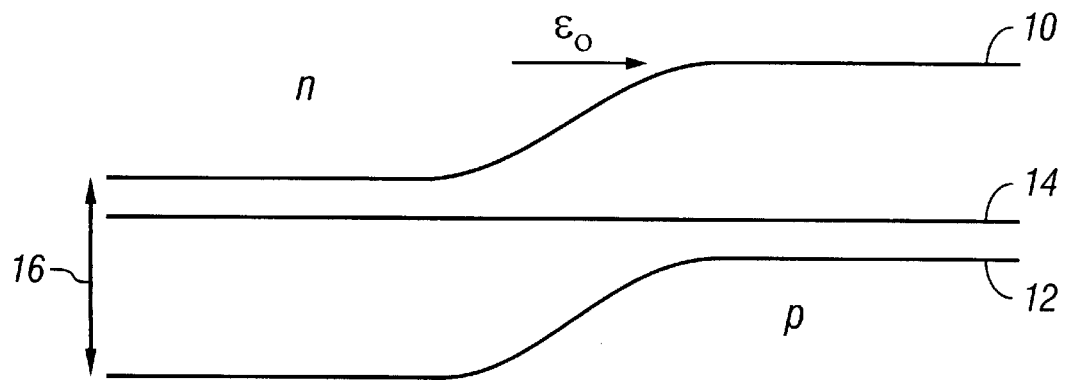
FIG. 1 includes exemplary energy band diagrams of a p-n junction photodetector.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Some of the problems discussed above may be addressed by a photodiode described herein having a blocking structure interposed between its absorption region and at least one of its contact regions. The blocking structure is adapted to prevent minority carriers generated within the adjacent contact region, or contact structure, from reaching the absorption region. As used herein, "preventing" carriers from reaching a particular region refers to providing an impediment to their movement, such that the number of carriers reaching the region is significantly reduced. The blocking structure may also prevent minority carriers generated within the absorption region near the contact structure from entering the contact structure. Majority carriers, on the other hand, may be substantially unimpeded by the blocking structure in moving from the absorption region to the contact structure. In an embodiment, the blocking structure has a higher effective energy gap than its adjacent contact structure and than the absorption region. The interface between the blocking structure and the absorption region may be graded, so that the effective energy gap decreases gradually between the blocking structure and the absorption region. The photodiode may be formed using semiconductor alloys and/or semiconductor superlattices, with some portions possibly formed from nonalloyed semiconductor materials.

This photodetector can increase the amount of electrical current collected due to light impinging on a photon detector and decrease the dark current. An embodiment of the detector exhibits increased collection efficiency of photogenerated carriers through the use of graded energy bands which can enhance the collection efficiency of minority carriers without creating barriers that inhibit the motion of majority carriers. In an embodiment, the detector also includes energy barriers to prevent undesired current from electrical carriers generated by processes other than photon absorption. Graded superlattices can be used to implement the photodetector.

In addition to the photodetector described above, a method for forming a photodetector is contemplated herein. In an embodiment, the method includes forming a first semiconductor-based blocking layer between an absorption layer and a first contact layer, where the first blocking layer is adapted to reduce passage of minority carriers from the first contact layer to the absorption layer. The method may further include forming a second contact layer on the opposite side of the absorption layer than the first contact layer, wherein the first and second contact layers are doped to opposite conductivity types. In an embodiment, a second blocking layer is formed between the absorption layer and such a second contact layer. For example, the method may include forming a first blocking layer on a doped semiconductor substrate, forming an absorption layer upon the first blocking layer, forming a second blocking layer upon the absorption layer, and forming a contact layer upon the second blocking layer. The first and second blocking layers are adapted to prevent minority carriers in the contact layers from reaching the absorption layer. In an embodiment, the layers are formed by an epitaxial growth technique such as molecular beam epitaxy.

Figure 1B:
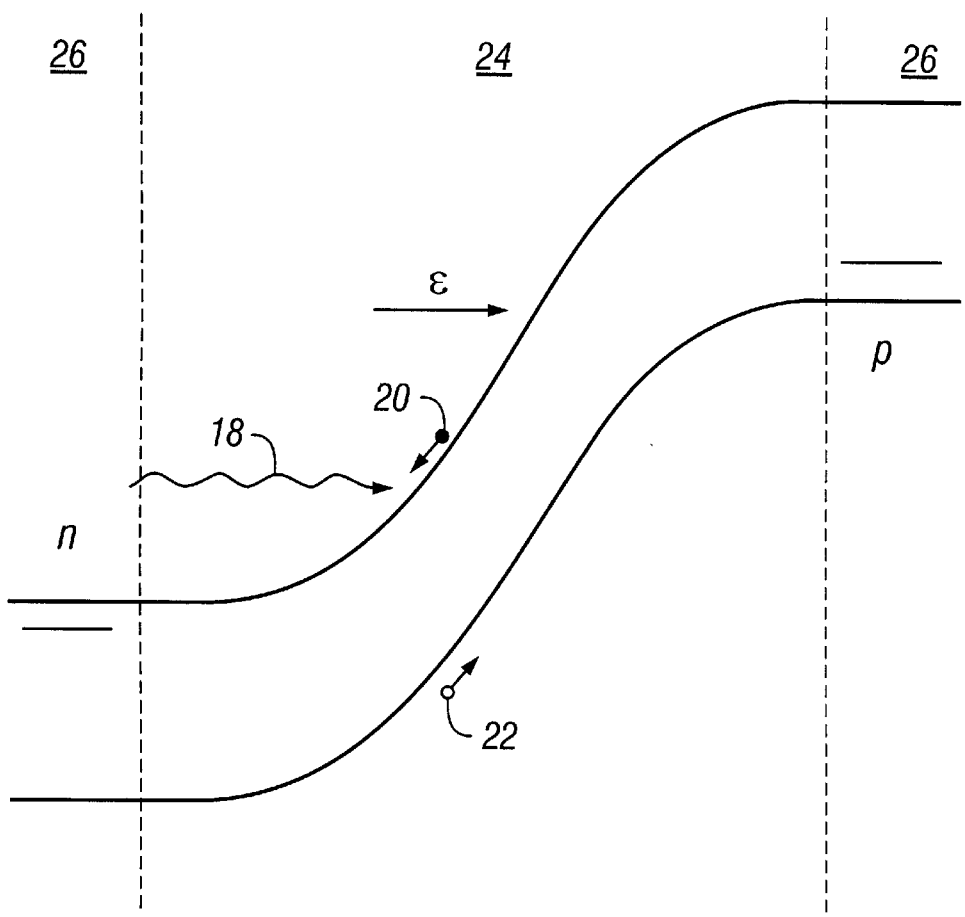
Figure 2A:
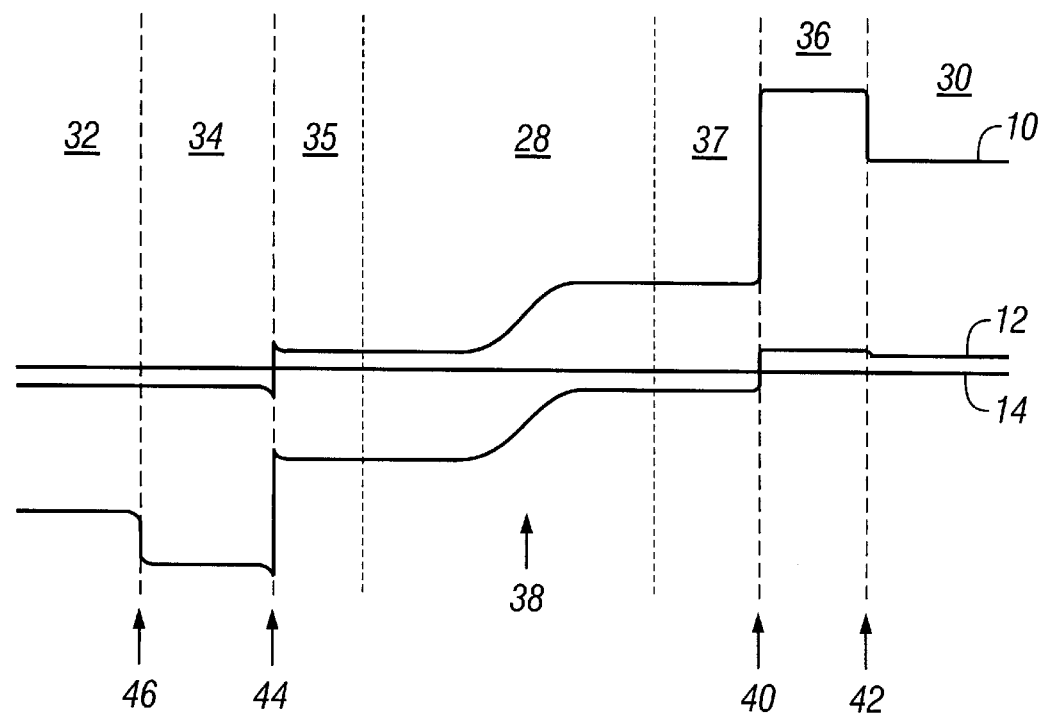
FIG. 2 includes exemplary energy band diagrams of a double heterostructure photodetector as described herein.

Energy band diagrams corresponding to exemplary embodiments of the photodiode described herein under equilibrium conditions are shown in FIG. 2. Vertical dashed lines on the band diagrams delineate boundaries between the corresponding regions of the photodetector. Conduction band edge 10, valence band edge 12, and Fermi level 14 are designated as in FIG. 1. The band diagram of FIG. 2(a) is for a photodiode which includes a p-n junction absorption region 28, where arrow 38 indicates the location of the p-n junction. N-type contact region, or contact structure, 32 is on one end of the detector, while p-type contact region 30 is at the other end. Between n-type contact 32 and absorption region 28 is an n-type blocking structure 34, and a p-type blocking structure 36 is between the absorption region and p-type contact 30. Blocking structure 34 has a larger energy gap (or effective energy gap, in the case of superlattice implementations) than either of contact region 32 and absorption region 28. Similarly, blocking structure 36 has a larger energy gap than either contact region 30 or absorption region 28. In the embodiment of FIG. 2(a), contact regions 32 and 30 each have a larger effective energy gap than does absorption region 28. Although such wider-gap contact regions are believed to be advantageous by, for example, limiting thermal generation in the contact regions, the contact regions may not have a larger bandgap than the absorption region in all embodiments. The photodetector of FIG. 2(a) may be called a double-heterostructure photodiode, since it includes heterojunctions at both ends of the absorption region.

The larger energy gap of n-type blocking structure 34 as compared to contact region 32, along with the heavy n-type doping of both regions, provides a potential barrier in the valence band preventing holes, the minority carriers in contact region 32, from crossing blocking structure 34 to reach absorption region 28. In this way, minority carriers generated within contact 32 (typically by thermal generation or other mechanisms other than the desired photogeneration) are prevented from contributing to the dark current of the photodetector. Similarly, heterojunction 42 between blocking structure 36 and contact region 30 presents a potential barrier to electrons, the minority carriers in p-type contact 30, preventing them from reaching the absorption region.

In addition to blocking minority carriers generated in the contact regions, blocking structures 34 and 36 also prevent minority carriers generated within the absorption region from moving into the "wrong" contact region. For example, holes generated on the n-type side of absorption region 28 during the normal reverse-biased operation of the photodetector are properly pulled across the absorption region to be collected by p-type contact 30. Because the generated carriers may also move by diffusion, however, holes generated in relatively close proximity to the n-type side of the junction may tend to move toward n-type contact 32 instead. Minority carriers generated within portion 35 of the absorption region, proximate the n-type blocking structure and contact, and within portion 37 of the absorption region, proximate the p-type blocking structure and contact, may particularly tend to diffuse "backwards" rather than drift across the junction. Lateral widths of portions 35 and 37 may be defined as approximately equal to the corresponding minority carrier diffusion length. Although shown in FIG. 2(a) as being larger than a minority carrier diffusion length in such an embodiment, the p-type and n-type sides of the absorption region may in other embodiments be comparable to or smaller than their respective minority carrier diffusion lengths.

Blocking structures 34 and 36 advantageously present potential barriers to block minority carriers generated within regions 35 and 37 from moving into contact structures 32 and 30, respectively. Heterojunction 44 between blocking structure 34 and absorption region 28, for example, presents a large potential barrier to holes on the n-type side of the absorption region, while heterojunction 40 between p-type blocking structure 36 and the absorption region presents a large potential barrier to electrons on the p-type side of the absorption region. The energy band structure at the heterojunctions of FIG. 2(a) includes discontinuities in the conduction and valence bands, to account for the difference in the bandgap on each side of the heterojunction, and for specifics of the band lineup at the heterojunction. Heterojunction band lineups may vary widely, depending on the particular materials on each side of the junction and on other factors such as strain. The junction discontinuities shown in FIG. 2(a) are therefore merely exemplary. In the embodiment of FIG. 2(a), heterojunctions 46, 40 and 42 exhibit monotonic variations in energy in the conduction and valence bands. The conduction and valence bands at heterojunction 44, on the other hand, move alternately up and down in crossing the heterojunction. This type of band lineup produces high-energy "spikes" and low-energy potential wells in the vicinity of the junction. Such potential variations may be disadvantageous by hindering the desired majority carrier flow. For example, the spike in the conduction band at heterojunction 44 presents a barrier to electrons flowing from absorption region 28 toward n-type contact 32. Furthermore, the potential wells at the interface may trap carriers, leading to increased recombination at the heterojunction. Even in the case of a heterojunction such as heterojunction 40 that does not exhibit such band edge potential variations, the presence of an abrupt heterojunction may result in increased recombination, such as interfacial surface recombination.

Figure 2B:
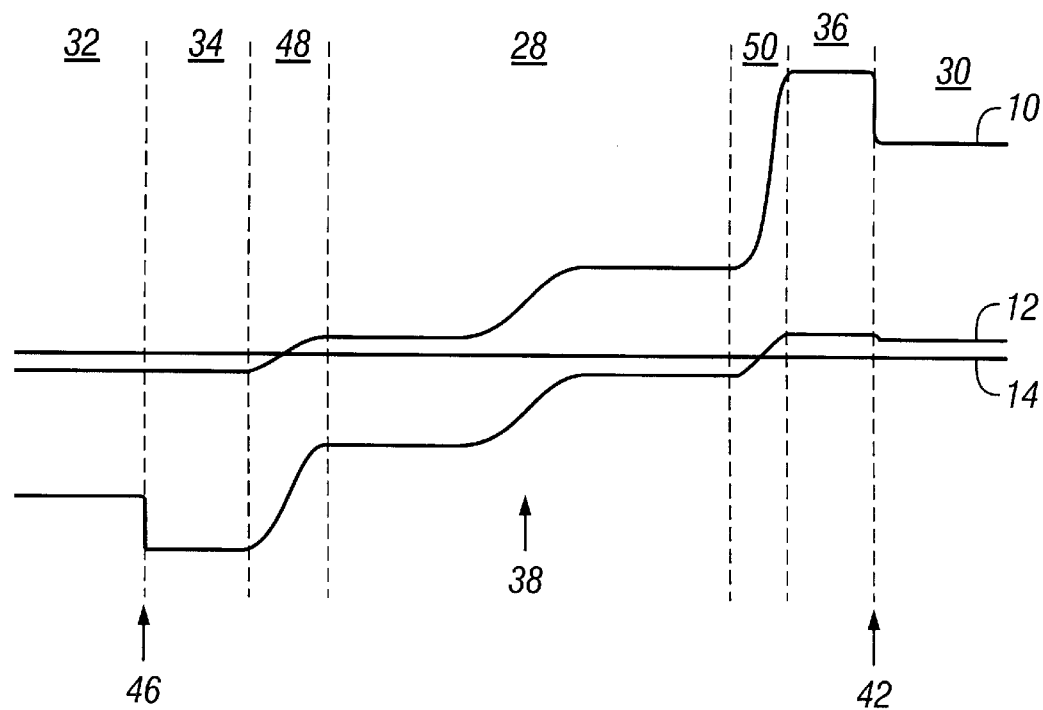

In a different embodiment of the photodetector shown in FIG. 2(b), abrupt heterojunctions 44 and 40 of FIG. 2(a) are replaced with graded-bandgap regions 48 and 50. Such graded-gap regions may be formed by varying the composition of a semiconductor alloy, or by varying parameters of a semiconductor superlattice, as described further below in the discussion of FIG. 3. The grading of the bandstructure in regions 48 and 50 substantially eliminates abrupt potential variations, such that the bandgap in each region gradually decreases in the direction approaching the absorption region. This advantageously reduces any barriers to majority carrier flow from the absorption region to the contact structures. It can be seen in the embodiment of FIG. 2(b), for example, that virtually no potential barrier is presented by graded region 48 to majority electrons moving from absorption region 28 toward contact 32. Similarly, graded region 50 presents virtually no barrier to majority holes moving from the absorption region toward contact 30. In practical embodiments, it is not necessary that graded regions such as graded regions 48 and 50 present actually zero potential barriers to majority carriers from the absorption region 28 to the respective contacts 32, 30. Instead, it can be advantageous if graded regions 48 and 50 present no significant potential barriers to such majority carriers, where "significant potential barrier" means a barrier that would noticeably or appreciably detrimentally affect carrier flow, as evidenced, for example, by detector performance. Thus, graded regions having substantially the characteristics illustrated in FIG. 2(b) are useful, in an embodiment, even if very small potential barrier "spikes" are present along the graded region, in practical implementations.

A slight hole barrier appears between barrier structure 36 and contact 30 in this embodiment, but this could be removed by heavier doping of contact 30 and possibly a grading of the interface between barrier 36 and contact 30.

The grading may essentially remove the effect of the specific band lineup between the two materials on the relative potential barriers for electrons and holes. Instead, the doping on each side of the junction may determine the relative barrier heights. In the detector of FIG. 2(b), for example, the n-type doping of both blocking structure 34 and the n-type side of absorption region 28 serves to align the conduction band edges of these regions relatively close together, so that a large part of the difference in bandgap between the two structures appears as a potential barrier in the valence band, or a barrier for holes. Potential wells, which may trap carriers at the heterointerfaces are also substantially eliminated by the grading. The resulting graded energy barriers may act to "push" the minority carriers in the absorption layer towards homojunction 38, and may be described as "reflecting" barriers or contacts. The heterojunction grading of FIG. 2(b) is believed to be advantageous even in the case of heterojunctions, such as junction 40 of FIG. 2(a), which exhibit apparently monotonic band edge potential variations. The grading of such junctions may, for example, reduce recombination and improve the reflection of minority carriers.

Although heterojunctions 46 and 42 between the blocking structures and contact structures remain abrupt junctions in the embodiment of FIG. 2(b), these junctions could also be graded in other embodiments. The particular energy gaps corresponding to the various regions of the photodiodes of FIG. 2 may vary depending on factors such as the detection wavelength desired and constraints of the materials used to fabricate the detector. The energy band offset between constituent layers or regions of the photodiode may be conveniently described in terms of the thermal energy kT, where k is the Boltzmann constant and T is the temperature in degrees Kelvin. The thermal energy kT is equal to approximately 0.026 electron volts (eV) at room temperature, and 0.007 eV at 77 K. As a rule of thumb, the barrier to minority carriers presented by the blocking layer should be greater than about 5–10 kT (0.035 to 0.070 eV at 77 K). In the embodiment of FIG. 2(b), this is roughly equivalent to making the bandgap of the blocking layer about 5–10 kT larger than the bandgap of either the contact layer or the absorption region. Ideally, but not necessarily, the contact layers should have band gaps larger than the absorption regions and should be non-absorbing in the spectral band of interest having an onset defined by the energy gap of the absorption region. In a detector designed for operation at a wavelength of 10 $\mu$m, for example, the effective bandgap in absorption region 28 may be approximately 0.12 eV. N-type contact structure 32 may have an effective bandgap equal to at least 0.12 eV and less than about 0.4 eV, while the bandgap of n-type blocking layer 34 may be at least 10 kT larger than that of contact layer 32. P-type contact structure 30 for such a detector may have a bandgap between about 0.12 eV and about 0.80 eV, while the energy gap of p-type blocking layer 36 may be at least 10 kT larger than the energy gap of contact layer 30.

Figure 3:
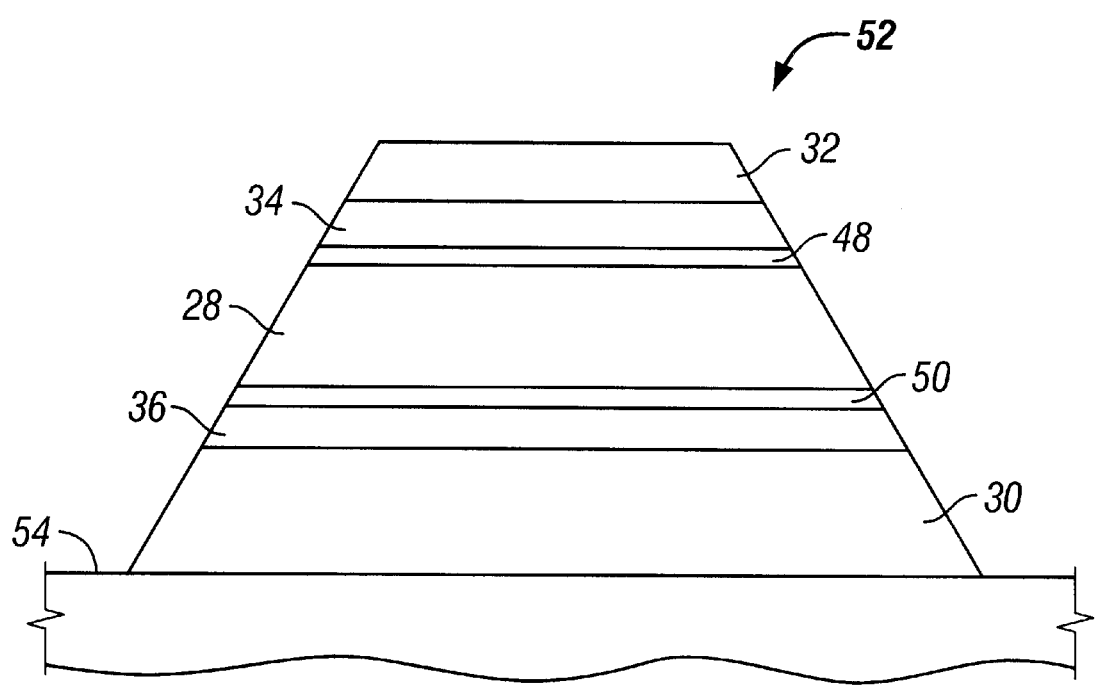
FIG. 3 is a cross-sectional view of a photodetector having an effective energy band structure similar to that of FIG. 2.

A cross-sectional view of a photodiode corresponding to the band diagram of FIG. 2(b) is shown in FIG. 3. Photodetector structure 52 includes multiple epitaxial layers grown onto substrate 54, and then etched to form a mesa structure. The reference numerals used for the layers correspond to those labeling the corresponding parts of the band diagram in FIG. 2(b). In the embodiment of FIG. 3, therefore, the lower portion of the photodiode is p-type, while the top is n-type. Substrate 54 is accordingly p-type in this embodiment. In other embodiments, however, an n-type substrate could be used to form a detector having its p-type portion at the top. The photodiode of FIG. 3 and portions thereof are formed from semiconductor-based materials, where "semiconductor-based" as used herein means formed largely from a semiconductor. In some cases, a semiconductor-based portion may also have non-semiconducting parts such as a passivation or metallization layer. A semiconductor-based structure could also include semi-metal portions in some embodiments, as in the case of some superlattices in the mercury-cadmium telluride materials system. Detector structure 52 is typically one of multiple detectors formed on a substrate such as substrate 54, where the individual detectors may either be separated after fabrication to form single-element detectors, or retained on the substrate to form a detector array. For single-element detectors the mesa size, or diameter at the top of structure 52, may range from about 0.05 to about 4 mm in some embodiments. Detectors within detector arrays may be somewhat smaller, such that the pitch (distance from mesa center to mesa center) of the array may in some cases range from about 0.03 to about 0.06 mm.

In the case of infrared wavelength detectors, suitable materials for substrate 54 may include gallium antimonide (GaSb). Substrates made from many other semiconductor materials may also be suitable, depending on various factors such as the detection wavelength, the particular materials system used, and specific layer thicknesses in the case of strained-layer growth. Semiconductor-based contact structure 30 is formed from a contact layer grown epitaxially onto substrate 54. In an embodiment for which substrate 54 is GaSb, contact structure 30 is conveniently formed from GaSb also. Other materials which may be grown on substrate 54 may also be used, however. The contact layer is doped with the same carrier type as the substrate, and is preferably about 0.5 $\mu$m thick or thicker (typically between about 0.5 $\mu$m and 1 $\mu$m). Such a relatively thick contact layer may also function as a "buffer layer" to mitigate the effects of any surface roughness and contamination present on substrate 54 before growth of the detector structure. In an embodiment for which a GaSb contact structure is used, the structure may be grown using molecular beam epitaxy (MBE) at a substrate temperature between about 500 and 550° C. (preferably about 530° C.). To make contact structure 30 p-type, as shown in FIGS. 2 and 3, beryllium (Be) doping may be used. Alternatively, intentional p-type dopants may be omitted in at least a portion of the contact layer if GaSb is grown by MBE, because MBE-grown GaSb is typically p-type in the mid-$10^{16}$ cm$^{-3}$ range. In embodiments for which substrate 54 is n-type, contact structure 30 could be formed from, for example, n-type GaSb doped with tellurium (Te) during growth.

Semiconductor-based blocking structure 36 may be formed from a blocking layer epitaxially grown over contact structure 30. The blocking layer is formed from a material having a larger effective bandgap than that of contact structure 30. In the embodiment described above having a GaSb contact structure, the blocking layer could be formed from, for example, an alloy of InGaAlSb. In a preferred embodiment, an In-free case of such an alloy, or an $Al_xGa_{1-x}Sb$ alloy, is used. Such an $Al_xGa_{1-x}Sb$ structure can be grown by MBE using a growth temperature between about 410 and 450° C., and doped p-type with Be. In the case of a 10 μm detector similar to that in the example above, having a p-type blocking structure with an effective bandgap of 1.0 eV, the Al concentration x for the alloy would be about 0.35. Superlattice structures consisting of, for example, alternating layers of $Al_xGa_{1-x}Sb$ and InAs, or $In_xAl_{1-x}Sb$ and InAs could also be used to form blocking structure 36. In an embodiment, the blocking layer is between about 0.1 and about 0.3 μm thick.

P-type graded region 50 may be formed from a graded-bandgap layer grown epitaxially upon blocking structure 36. Such a graded bandgap layer could be formed from an alloy or superlattice in, for example, the indium gallium arsenide antimonide (InGaAsSb) and/or the indium gallium aluminum antimonide (InGaAlSb) materials systems. A layer made using these materials systems can be grown using MBE and doped with a p-type dopant such as Be. An alloy in the InGaAsSb system may be written as $In_xGa_{1-x}As_ySb_{1-y}$, where the In fraction x and As fraction y are each less than 1. Similarly, an alloy in the InGaAlSb system may be written as $In_xGa_yAl_{1-x-y}Sb$, where the In fraction x and Ga fraction y are each less than 1. The fractions x and y may also be zero, in which case these quaternary alloys reduce to ternary alloys or binary compound semiconductors. A superlattice which may be suitable for forming graded region 50 has alternating layers of InAs and InGaAlSb. In the case of an alloy implementation of graded region 50, fractions x and/or y are varied during the growth of the graded region such that the effective energy gap decreases from that of blocking structure 36 to that of absorption region 28.

In the case of a superlattice implementation, there are various ways to achieve the graded bandgap. For example, the constituent layer compositions could remain invariant throughout the superlattice, while the constituent layer thicknesses are changed. Considering n-type graded-bandgap region 48 in such an embodiment, for example, an InAs/InAlSb superlattice could be used in which the InAs and InGaAlSb layers are thinner adjacent blocking structure 34, and gradually increase in thickness while approaching absorption region 28. In some embodiments, the thickness of one of the constituent layers could remain invariant, while that of the other constituent layers is varied. In the case of the example given above for a 10 μm detector, a suitable superlattice implementation of graded region 48 may include an InAs/InAlSb superlattice in which the InAs layers and InAlSb layers are about 24 Å thick and about 12 Å thick, respectively, adjacent to blocking layer 34, while the InAs layers and InAlSb layers are about 33 Å thick and about 12 Å thick, respectively, adjacent to absorption region 28.

Alternatively, the constituent layer thicknesses could be invariant throughout the superlattice, and the composition of one or more of the constituent layers be changed. For example, an $InAs/In_xGa_yAl_{1-x-y}Sb$ superlattice could have constant layer thicknesses, but a variation in the composition of the InGaAlSb layers across the graded region. An increase in the In fraction x and/or a decrease in the Ga fraction 1−x−y, for example, might be used to lower the effective energy gap of the superlattice while approaching the absorption region. An alternative superlattice implementation of graded region 48 for the 10 μm detector example discussed above may have, for example, InAs layers 30 Å thick throughout the graded region, alternating with InAlSb layers 20 Å thick throughout the graded region. In terms of the InAs/InGaAlSb superlattice mentioned above, the $In_xGa_yAl_{1-x-y}Sb$ layers could have an Al fraction 1−x−y of about 1 (i.e., all Al, no In or Ga) at the end of the graded region adjacent blocking structure 34, varying to an Al fraction 1−x−y of about 0.2 at the end of the graded region adjacent absorption region 28, with the Ga composition y set to zero throughout the graded region 48. In other embodiments of the photodetector, the above approaches could also be combined, with both compositional and thickness variations used to form the graded-bandgap region. Variation of superlattice parameters as described above may involve making each superlattice period different than the periods adjacent to it. Alternatively, the variation may in some embodiments involve maintaining the same parameter for two or more periods of the superlattice, then changing a parameter for an adjacent set of periods, and so forth, in a stepwise approach to the grading. Similarly, a graded region formed in an alloy implementation could have grading that is continuous (within constraints of the materials growth equipment used) or stepwise. However the grading is performed, it should preferably be consistent with the grading considerations described below.

P-type graded region 50 is similar to graded region 48, but is of course doped to have opposite conductivity type. Furthermore, for a detector such as that of FIG. 2, implementation of the p-type and n-type graded regions is appropriately adjusted to accommodate the different energy band discontinuity between the absorption region and blocking layer 36 on the p-side as compared to blocking layer 34 on the n-side. In either case, considerations involved in implementation of the graded layer include ensuring that the grading is steep enough to provide a sufficient electric field to counteract diffusion of minority carriers from the absorption region toward the contact regions. The spatial variation of the appropriate energy band edge needed to provide sufficiently steep grading may be described in a simplified model in terms of the minority carrier mobility μ, diffusion length L, and recombination lifetime τ. In such an approximation, the derivative $dE_g/dz$ of the bandgap with respect to distance should be greater than L/μτ (assuming that the derivative of the band edge providing the minority carrier barrier is approximately equal to the derivative of the bandgap). A further consideration involved in implementation of the graded layer is that the grading should be smooth enough that carrier wavefunctions continuously overlap throughout the graded region. In view of these considerations, a suitable thickness for graded regions 48 and 50 may be about 0.1 μm in some embodiments.

Semiconductor-based absorption region 28 may be grown epitaxially on graded region 50. As in the case of other regions of detector structure 52, absorption region 28 can be formed using various semiconductor alloys or superlattices. In the case of the example given above for a 10 μm detector, a suitable superlattice implementation of absorption region 28 may include alternating InAs and $In_xGa_{1-x}Sb$ layers, where the In fraction x is about 0.23, the InAs layer thickness is about 43 Å, and the InGaSb layer thickness is about 17 Å. In the embodiment of FIGS. 2 and 3, absorption region 28 contains a p-n homojunction. The p-type side of the junction may be doped with a p-type dopant such as Be, and the n-type side of the junction may be doped with an n-type dopant such as Si. In an embodiment, absorption region 28 is between about 1 μm and about 3 μm thick. Although shown as a p-n homojunction in FIGS. 2 and 3, the absorption region could take various forms. In a further embodiment, for example, the absorption region could include an intrinsic (or at least low-doped) region between the p-type and n-type sides of the junction, to form a p-i-n photodetector. The feasibility of forming an intrinsic region depends on the particular semiconductor material used. In some embodiments, furthermore, an avalanche photodiode could be formed, such that absorption region 28 (more appropriately considered an "active" region in this case) includes an absorption region and an avalanche multiplication region. Such an avalanche photodiode for infrared wavelengths may have a narrow gap absorption region without a junction, adjacent to a junction formed in a wider-gap material where the avalanche multiplication occurs. In such an embodiment, the bandgap at one end of absorption region 28 is different than that at the other end.

Blocking structure 34 and contact structure 32 are similar to blocking structure 36 and contact structure 30 described above, except for being of the opposite conductivity type. Contact structure 32 may also be formed from a thinner layer than contact structure 30. In an embodiment, contact structure 32 has a thickness between about 0.2 $\mu$m and about 0.5 $\mu$m. In the embodiment of FIG. 2, n-type blocking structure 34 has a smaller effective bandgap than does p-type blocking structure 36, and n-type contact 32 has a smaller effective bandgap than does p-type contact structure 30. This would not necessarily be the case in other embodiments, however. In an embodiment such as that of FIG. 2, specific implementations of the blocking and contact regions may be appropriately adjusted on each side of the junction to accommodate the differences in bandgap. After growth of the layers shown in FIG. 3 and etching to form detector structure 52, continued fabrication of a detector or detector array may include formation of conductive contacts to contact structures 32 and 30. In the case of a detector array, each detector mesa element in the array may have an individual metal connection to the contact layer on the top of the mesa while the bottom contact layer may serve as a common contact for all detector elements, with a metal contact applied to this layer at the array perimeter. In some cases, detectors as described herein may be cooled to temperatures between about 77 K and 240 K during operation using liquid nitrogen and/or thermoelectric cooling. Depending on the particular detector implementation and application, however, room temperature operation may also be suitable.

It will be appreciated to those skilled in the art having the benefit of this disclosure that this invention is believed to provide a radiation detector having improved collection efficiency and reduced dark current. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A radiation detector, comprising:
   a semiconductor-based absorption region;
   first and second semiconductor-based contact structures arranged on either side of the absorption region, respectively, wherein the first and second contact structures are doped to make one of them p-type and the other n-type; and
   first and second semiconductor-based blocking structures interposed between the absorption region and the first and second contact structures, respectively, wherein the first and second blocking structures are adapted to reduce passage into the absorption region of minority carriers generated within the first and second contact structures, respectively.

2. The detector of claim 1, wherein a first portion of the absorption region proximate the first contact structure is doped to the same conductivity type as the first contact structure, and a second portion of the absorption region proximate the second contact structure is doped to the same conductivity type as the second contact structure.

3. The detector of claim 2, wherein the absorption region comprises an undoped or low-doped portion between the first and second portions.

4. The detector of claim 2, wherein the first and second portions of the absorption region have different effective energy gaps.

5. The detector of claim 2, wherein the first blocking structure is further adapted to reduce passage into the first contact structure of minority carriers within the first portion of the absorption region, and the second blocking structure is further adapted to reduce passage into the second contact structure of minority carriers within the second portion of the absorption region.

6. The detector of claim 5, wherein the first blocking structure comprises a larger effective energy gap than that of the first contact structure and than that of the first portion of the absorption region, and wherein the second blocking structure comprises a larger effective energy gap than that of the second contact structure and than that of the second portion of the absorption region.

7. The detector of claim 6, wherein a first semiconductor-based interface between the first blocking structure and the absorption region comprises a gradually decreasing effective energy gap in a direction approaching the absorption region, and a second semiconductor-based interface between the second blocking structure and the absorption region comprises a gradually decreasing effective energy gap in a direction approaching the absorption region.

8. The detector of claim 7, wherein the first and second interfaces comprise first and second semiconductor superlattice structures, respectively, and wherein one or more parameters of each superlattice structure varies to form the respective gradually decreasing effective energy gap.

9. The detector of claim 8, wherein said one or more parameters comprises a thickness of a constituent layer of the superlattice structure.

10. The detector of claim 8, wherein said one or more parameters comprises a material composition of a constituent layer of the superlattice structure.

11. The detector of claim 8, wherein the first and second superlattice structures comprise alternating layers of InAs and $In_xGa_yAl_{1-x-y}Sb$, with values of x and y within the range from 0 to 1.

12. The detector of claim 11, wherein the first and second blocking structures comprise $In_xGa_yAl_{1-x-y}Sb$, with values of x and y within the range from 0 to 1.

13. The detector of claim 12, wherein the absorption region comprises a third superlattice structure having alternating layers of InAs and $In_xGa_{1-x}Sb$, with a value of x within the range from 0 to 1.

14. The detector of claim 13, wherein the first contact structure is formed within a GaSb substrate.

15. The detector of claim 5, wherein the first blocking structure is further adapted to allow substantially unimpeded passage of majority carriers from the first portion of the absorption region to the first contact structure, and the second blocking structure is further adapted to allow substantially unimpeded passage of majority carriers from the second portion of the absorption region to the second contact structure.

16. The detector of claim 7, wherein the first interface is adapted to present no significant potential barrier to the majority carriers in the first portion of the absorption region, and the second interface is adapted to present no significant potential barrier to the majority carriers in the second portion of the absorption region.

17. The detector of claim 16, wherein:
the first interface is further adapted to present to the minority carriers in the first portion of the absorption region, under equilibrium conditions, a potential barrier approximately equal to a difference between the effective energy gaps of the first blocking structure and the first portion of the absorption region; and
the second interface is further adapted to present to the minority carriers in the second portion of the absorption region, under equilibrium conditions, a potential barrier approximately equal to a difference between the effective energy gaps of the second blocking structure and the second portion of the absorption region.

18. The detector of claim 7, wherein a third semiconductor-based interface between the first blocking structure and the first contact structure comprises a gradually decreasing effective energy gap in a direction approaching the first contact structure, and a fourth semiconductor-based interface between the second blocking structure and the second contact structure comprises a gradually decreasing effective energy gap in a direction approaching the second contact structure.

19. The detector of claim 18, wherein the third and fourth interfaces comprise third and fourth semiconductor superlattice structures, and wherein one or more parameters of each superlattice structure varies to form the respective gradually decreasing effective energy gap.

20. A radiation detector, comprising:
a semiconductor-based absorption region arranged between first and second semiconductor-based contact structures, wherein the first and second contact structures are doped to opposite conductivity type;
means for impeding passage into the absorption region of minority carriers generated within the first contact structure; and
means for impeding passage into the absorption region of minority carriers generated within the second contact structure.

21. The detector of claim 20, wherein a first portion of the absorption region proximate the first contact structure is doped to the same conductivity type as the first contact structure, and a second portion of the absorption region proximate the second contact structure is doped to the same conductivity type as the second contact structure.

22. The detector of claim 21, further comprising:
means for impeding passage into the first contact structure of minority carriers from the first portion of the absorption region; and
means for impeding passage into the second contact structure of minority carriers from the second portion of the absorption region.

* * * * *